United States Patent
Humbert et al.

(10) Patent No.: US 8,350,308 B2
(45) Date of Patent: Jan. 8, 2013

(54) REVERSE ENGINEERING RESISTANT READ ONLY MEMORY

(75) Inventors: Aurelie Humbert, Brussels (BE); Pierre Goarin, Graz (AT); Romain Delhougne, Muizen (BE)

(73) Assignee: NXP B.V., Eindhoven (NL)

( * ) Notice: Subject to any disclaimer, the term of this patent is extended or adjusted under 35 U.S.C. 154(b) by 313 days.

(21) Appl. No.: 12/920,747

(22) PCT Filed: Mar. 5, 2009

(86) PCT No.: PCT/IB2009/050903
§ 371 (c)(1),
(2), (4) Date: Sep. 2, 2010

(87) PCT Pub. No.: WO2009/109932
PCT Pub. Date: Sep. 11, 2009

(65) Prior Publication Data
US 2011/0006352 A1    Jan. 13, 2011

(30) Foreign Application Priority Data
Mar. 6, 2008  (EP) .................................. 08102335

(51) Int. Cl.
*H01L 27/108*    (2006.01)

(52) U.S. Cl. ......... 257/296; 257/E21.666; 257/E27.084; 438/381

(58) Field of Classification Search .................. 257/296, 257/E21.666, E27.084; 438/381
See application file for complete search history.

(56) References Cited

U.S. PATENT DOCUMENTS

| | | |
|---|---|---|
| 4,294,001 A | 10/1981 | Kuo |
| 6,756,275 B1 | 6/2004 | Liu et al. |
| 2002/0063268 A1 | 5/2002 | Vajana et al. |
| 2005/0245098 A1 | 11/2005 | Cooney et al. |
| 2006/0138592 A1 | 6/2006 | Block et al. |
| 2007/0205248 A1 | 9/2007 | Horng et al. |

FOREIGN PATENT DOCUMENTS

| | | |
|---|---|---|
| EP | 1 102 320 A1 | 5/2001 |
| JP | 02222169 A | 9/1990 |

OTHER PUBLICATIONS

International Search Report and Written Opinion for Application PCT/IB2009/050903 (Mar. 5, 2009).

*Primary Examiner* — Tan N Tran

(57) ABSTRACT

A read only memory is manufactured with a plurality of transistors (4) on a semiconductor substrate (2). A low-k dielectric (10) and interconnects (14) are provided over the transistors (4). To program the read only memory, the low-k dielectric is implanted with ions (22) in unmasked regions (20) leaving the dielectric unimplanted in masked regions (18). The memory thus formed is difficult to reverse engineer.

10 Claims, 3 Drawing Sheets

REVERSE ENGINEERING RESISTANT READ ONLY MEMORY

The invention relates to a read only memory, in particular a read only memory intended to inhibit unauthorised access to the data.

Read only memories (ROMs) are programmed during IC fabrication. Normally, the programming is accomplished by a single mask at some stage of the IC fabrication, though the stage used can vary.

For example, each byte may be set by mask design at the metal contact level. In this case, a metal contact is either made (1) or not made (0) to connect a transistor to the bit line. Alternatively, the bytes may be set by the mask for the implantation step—an implant is performed in a transistor or not to create either an enhancement mode transistor or a depletion mode transistor. A further approach is to mask to create a thick or thin gate oxide, creating either a standard transistor or a high threshold transistor.

The approach chosen is a trade-off between process complexity, chip size and manufacturing cycle time.

Read only memories are used in a number of applications, for example for storing video game software and fixed data for electronic equipment, for example fonts for laser printers, dictionary data in word processors, or sound data in electronic musical instruments.

For many of these applications, it is desirable to avoid the possibility of the data on the read only memory being reverse engineered, i.e. read illicitly. In some cases, it may be possible to remove silicon in a backside deprocessing step revealing the layer programmed by the mask and thus read the data.

Conventional processes allow such deprocessing. For example, where the ROM is programmed on the metal contact mask layer, deprocessing allows the metal contact mask to be seen visually, allowing data to be read.

There is accordingly a need for a ROM which is resistant to deprocessing.

Such a ROM is described in US 2002/0063268. In the approach described there, a lower mask forms contacts to those cells to be programmed in one state, and then a subsequent mask forms apparent contacts above all cells, to disguise the layout. However, the process is highly complex.

It is also desirable that the process can be readily changed to allow a ROM programmed with new data to be rapidly brought to market.

According to the invention there is provided a method of manufacturing a read only memory according to claim 1.

The read only memory is highly resistant to reverse engineering. It is very difficult indeed to deprocess the read only memory from the rear of the substrate and even if the substrate could be deprocessed from the front the data is not susceptible to visual inspection of the memory.

The step of implanting the mask may be done in the back end of line (BEOL) i.e. after the first metallisation.

This allows a short manufacturing cycle.

In another aspect, the invention relates to a read only memory according to claim 7.

As mentioned above, the read only memory is highly resistant to reverse engineering.

For a better understanding, embodiments of the invention will now be described, purely by way of example, with reference to the accompanying drawings, in which.

The figures are schematic and not to scale. Like or similar components are given the same reference numbers.

Figure 1:
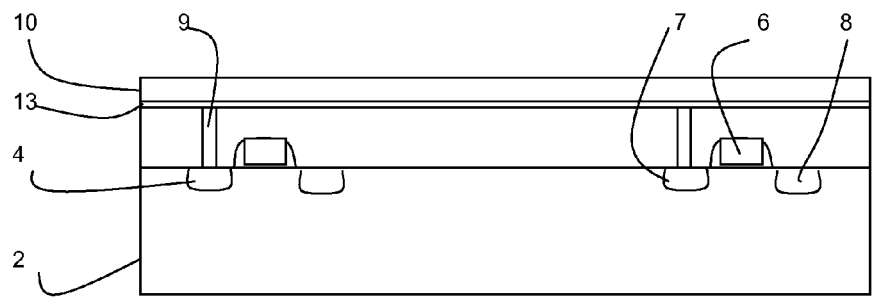
FIGS. 1 to 3 illustrate steps in a method according to an embodiment of the invention.
Figure 2:
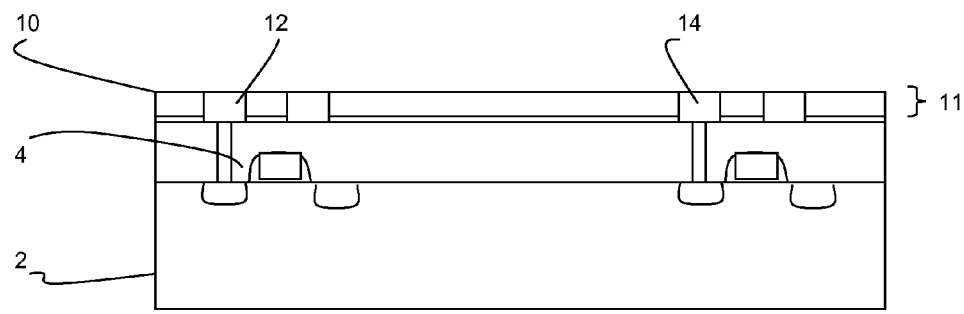
Figure 3:
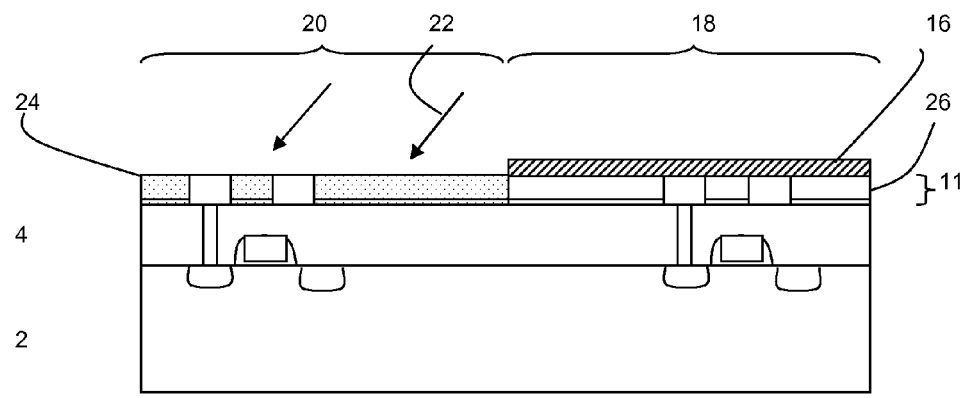

Referring to FIGS. 1 to 3, a low-k dielectric layer 10 is formed on a substrate 2 that has already been through the front end processing to form transistors 4 and other components if required. The transistors have a gate 6, source 7, and drain 8, and in the example shown a contact 9 is already formed.

If required, the low-k dielectric 10 is formed to have more than one layer which may be of different materials, for example a thin first layer 13 of one material followed by the main layer of the low-k dielectric 10. Optionally, the thin first layer 13 need not be low-k since the properties of the low-k dielectric will be dominated by the thicker low-k layer.

This is the state shown in FIG. 1.

The low-k dielectric layer 10 is then patterned to form trenches 12.

Copper is then deposited over the whole surface and a chemical mechanical polishing step carried to etch the copper back to the trenches 12 to form copper interconnects 14 filling the trenches, surrounded by low-k dielectric. The interconnects 14 and low-k dielectric form a damascene copper interconnect layer 11 as shown in FIG. 2.

Next, a programming mask 16 is deposited. The mask defines the data to be programmed by masked regions 18 corresponding to transistors which are to be programmed in one state, and unmasked regions 20 corresponding to the other transistors 4 which are to be programmed in the other state. Thus, in the embodiment the programming mask 16 defines which transistors are programmed "1" and which "0".

An ion implantation step implanting ions 22 such as those mentioned below is then performed to implant the low-k dielectric in the unmasked region, to form implanted dielectric 24 in the unmasked region, leaving unimplanted dielectric 26 in the masked region.

The programming mask 16 is then removed, leaving the programmed read only memory.

Figure 4:
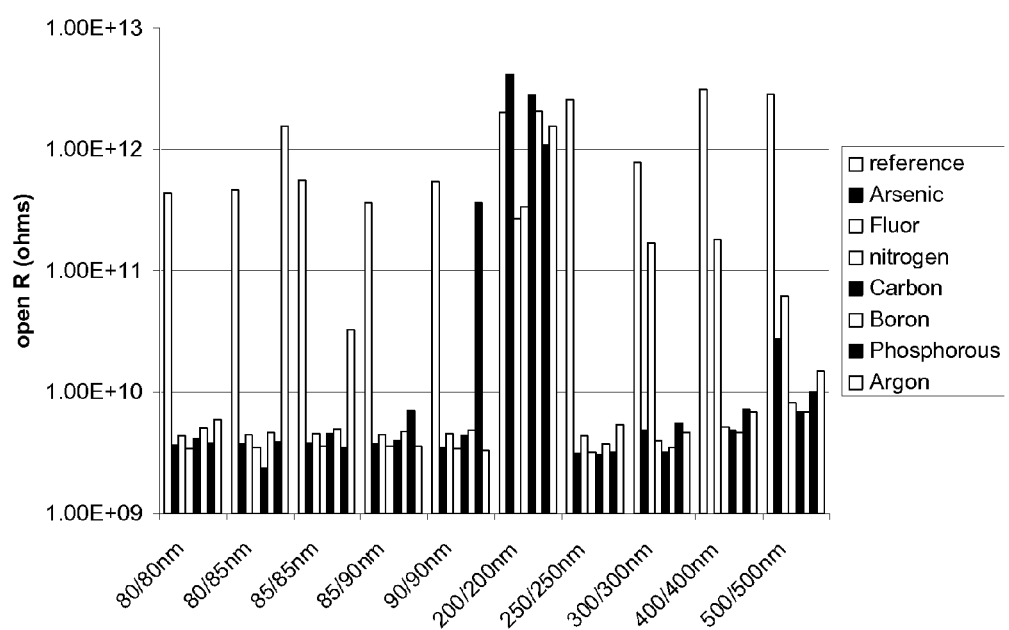
FIG. 4 illustrates the effect of implantation on open resistance.

Initial experiments have been measured to identify implantation effects, and are presented in FIG. 4. It should however be noted that these experiments are preliminary and do not in any sense represent optimised processes. Instead, the experiments are intended to confirm that implantation does give rise to sufficient changes in properties to be used to program the ROM.

FIG. 4 illustrates the resistance of low-k dielectric both in its original (unimplanted) state and with a number of ion implants. The implants selected include in particular arsenic, fluorine, nitrogen, carbon, boron, phosphorous, and argon. For each process, the resistance is presented in the same order of implants as indicated in the key to the graph. The implant affects the open resistance of the implant. The resistance has been measured in a number of processes from an 80/80 nm process to a 500/500 nm process. It will be seen that particularly good results are seen in the smaller process sizes which are of particular interest for the future.

Experiments have also been conducted which show that the capacitance of a capacitor including the low-k dielectric is also affected by the implantation of the same ions.

The invention is not limited to these implant materials and others can be made.

These changes in the dielectric can be used in a number of ways.

Firstly, the device may use the change in leakage current through the low-k dielectric as a result of implantation. A change of three orders of magnitude in leakage current may be achieved. Although the leakage current is small, it is sufficient to charge the gate of a transistor to conduct a current.

Alternatively, the change in capacitance of a capacitor having the low-k dielectric as its dielectric can also be used to change the voltage applied to the gate of a transistor through the capacitance.

Thus, in both cases the transistor of the memory cell is driven in some sense through or across the low-k dielectric in such a manner that implantation changes the properties sufficiently to be detected.

Figure 5:
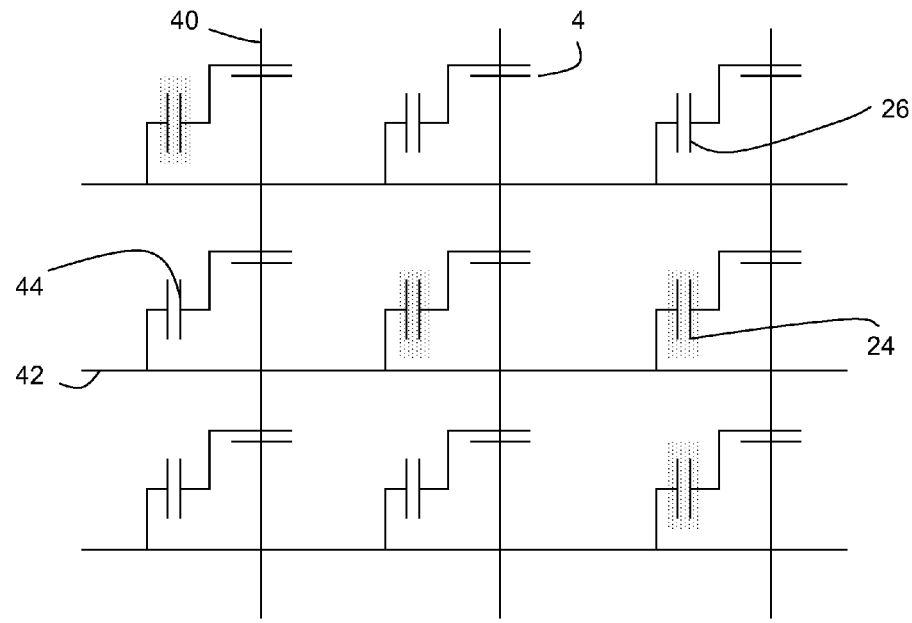
FIG. 5 illustrates one embodiment of a memory cell array according to the invention.

One arrangement in which this can be achieved is shown in FIG. 5.

An array of transistors 4 has word-lines 40 connected to the gates of the transistors and bit-lines 42 connected to the sources of the transistors, the bit-lines and word lines extending in perpendicular directions with one transistor at each intersection.

The interconnect between each transistor 4 and its respective bit-line 42 includes a pair of interconnect lines separated by a region of low-k dielectric and hence forming a capacitor 44. The low-k dielectric of the capacitor is either implanted or unimplanted as explained above, the dots in the drawing indicated the implanted dielectric 24 and the regions without dots indicating the unimplanted dielectric 26. Transistors in one state are assigned to the binary value "0" and transistors in the other state are assigned the binary value "1"—it will be appreciated by those skilled in the art that this assignment is essentially binary.

Accordingly, FIG. 5 shows a programmed ROM holding data.

The properties of dielectric change as a result of the implantation which allows the read-only memory to be read. In particular, both the capacitance and open resistance change. Either or both of these properties may be used depending on the exact properties of the implant chosen. The current through the transistor across capacitor 44 thus changes as a result of the implant which makes it possible for the state of the transistor to be read.

Figure 6:
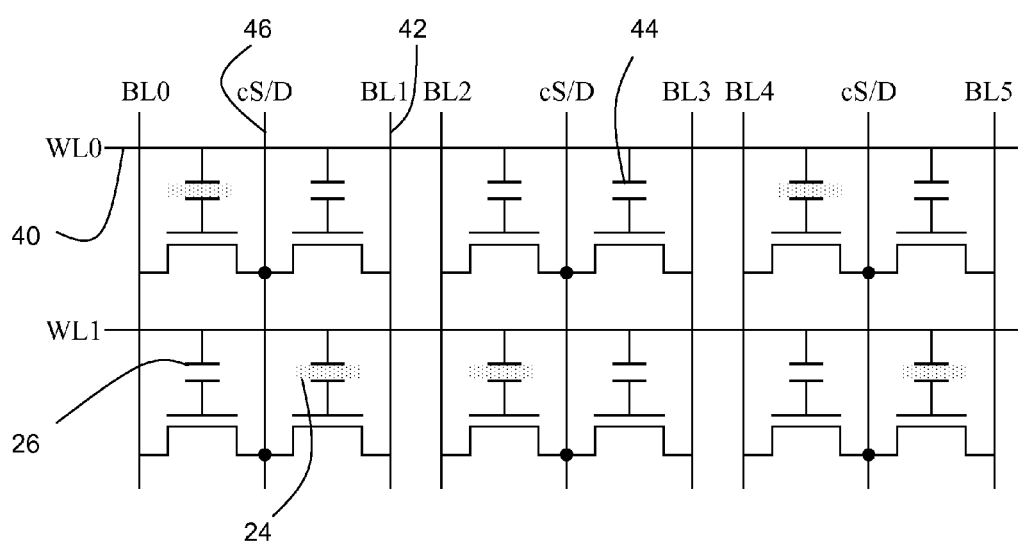
FIG. 6 illustrates one embodiment of a memory cell array according to the invention.

FIG. 6 illustrates another arrangement, with common source/drain lines 46 shared between pairs of transistors. In this case, the implantation affects capacitor 44 between the gate of each transistor 4 and the respective word line 40, the properties of the capacitors with implanted dielectric 24 differing from those with unimplanted dielectric 26. Again, either the change in the leakage current across the capacitor or the change in the capacitance itself may be used.

The embodiments shown have a number of advantages. The main advantage is that the process cannot be deprocessed from the rear of the substrate.

Frontside deprocessing is more difficult due to the materials used. Moreover, even if frontside deprocessing were to be carried out, to reveal the low-k dielectric layer, visual inspection of the layer would not be sufficient. Instead, it would be necessary to make costly and time consuming experiments to determine which elements of the array were implanted.

A further benefit is that the mask step takes place right at the end of the back end of line, allowing all the steps up until the programming mask step to be carried out in advance and in quantity, so that only the programming mask step and implantation need to be carried out to program the particular read only memory with data. This leads to a shorter cycle time since only the programming mask and implantation steps need to be carried out to program the device.

In another embodiment, the implant energy and dose are varied to tune the open resistances and capacitances. In that case, each memory element can have a number of different states allowing the invention to deliver a multi-bit memory.

It will be appreciated that there are many other ways of connecting transistors to make a read-only memory and the invention is not just limited to the embodiments set out above.

Nor must the process use a copper damascene process but other interconnect materials and processes for forming low-k dielectrics may be used if required.

Moreover, although the embodiments described use a single level of interconnect those skilled in the art will realise that multiple levels of interconnect may be used if required. The implantation and programming can take place in any or all of the levels.

The invention claimed is:

1. A method of manufacturing a programmed read only memory, comprising:
   forming a plurality of transistors on a semiconductor substrate;
   forming an interconnect layer of low-k dielectric and interconnect;
   forming a programming mask over the low-k dielectric, the programming mask having masked regions and unmasked regions defining data; and
   implanting the low-k dielectric through the unmasked regions but not the masked regions to form the read only memory programmed with the data.

2. A method according to claim 1, wherein forming the interconnect layer includes forming capacitors having the low-k dielectric as dielectric, wherein implanting the low-k dielectric implants the dielectric of the capacitors in the unmasked regions but not the masked regions to program the read only memory.

3. A method according to claim 2 wherein the capacitors are formed between word lines and the gate of each transistor.

4. A method according to claim 2 wherein the capacitors are formed between bit lines and the source or drain of each transistor.

5. A method according to claim 1, wherein forming the interconnect layer includes:
   patterning the low-k dielectric to define trenches;
   depositing copper over the whole surface; and
   chemical mechanical polishing to remove any copper over the low-k dielectric to leave the copper in the trenches to form the interconnects.

6. A method according to claim 1, wherein implanting includes implanting the dielectric with arsenic, fluorine, nitrogen, carbon, boron, phosphorous and/or argon ions.

7. A read only memory, comprising:
   a plurality of transistors on a semiconductor substrate;
   an interconnect layer including a low-k dielectric and interconnects above the transistors;
   wherein the low-k dielectric has implanted dielectric in the region of some transistors and un-implanted dielectric in the region of other transistors to define the data in the read only memory.

8. A read only memory according to claim 7, wherein the interconnect layer includes capacitors, the data in the read-only memory being defined by the un-implanted dielectric in some capacitors and the implanted dielectric in other capacitors.

9. A read only memory according to claim 8 wherein the capacitors are formed between word lines and the gates of each transistor.

10. A read only memory according to claim 8 wherein the capacitors are formed between bit lines and the source or drain of each transistor.

* * * * *